(12) United States Patent
Coustans et al.

(10) Patent No.: US 11,025,166 B2
(45) Date of Patent: Jun. 1, 2021

(54) DC-DC CONVERTER FOR A LOW VOLTAGE POWER SOURCE

(71) Applicant: EM MICROELECTRONIC-MARIN S.A., Marin (CH)

(72) Inventors: Mathieu Coustans, Aarau (CH); Yves Theoduloz, Yverdon-les-Bains (CH); Jerome Saby, Colombier (CH); Cyril Marti, Lignieres (CH); Mario Dellea, La Chaux-de-Fonds (CH)

(73) Assignee: EM MICROELECTRONIC MARIN S.A., Marin (CH)

( * ) Notice: Subject to any disclaimer, the term of this patent is extended or adjusted under 35 U.S.C. 154(b) by 68 days.

(21) Appl. No.: 16/668,294

(22) Filed: Oct. 30, 2019

(65) Prior Publication Data

US 2020/0153334 A1    May 14, 2020

(30) Foreign Application Priority Data

Nov. 13, 2018 (EP) .................................. 18206016

(51) Int. Cl.
| | |
|---|---|
| H02M 3/158 | (2006.01) |
| H02M 1/36 | (2007.01) |
| H02M 3/07 | (2006.01) |
| H03K 3/03 | (2006.01) |

(52) U.S. Cl.
CPC ............ *H02M 3/158* (2013.01); *H02M 1/36* (2013.01); *H02M 3/073* (2013.01); *H02M 2003/076* (2013.01); *H03K 3/0315* (2013.01)

(58) Field of Classification Search
CPC ......... H02M 3/158–1588; H02M 1/36; H02M 2003/075; H03K 3/0315–0322
See application file for complete search history.

(56) References Cited

U.S. PATENT DOCUMENTS

| 9,923,453 B1* | 3/2018 | Lee | H01L 35/02 |
| 2008/0150508 A1* | 6/2008 | Sohma | H02M 3/156 |
| | | | 323/283 |
| 2011/0134665 A1* | 6/2011 | Ivanov | H02M 1/36 |
| | | | 363/49 |
| 2011/0279105 A1 | 11/2011 | Hirose | |

(Continued)

FOREIGN PATENT DOCUMENTS

| WO | 2015/120131 A1 | 8/2015 |
| WO | 2016/118083 A1 | 7/2016 |

OTHER PUBLICATIONS

European Search Report for 18 20 6016 dated May 6, 2019.

*Primary Examiner* — Thienvu V Tran
*Assistant Examiner* — Sisay G Tiku
(74) *Attorney, Agent, or Firm* — Sughrue Mion, PLLC

(57) ABSTRACT

The invention relates to a DC-DC converter (1) for a power source (2) generating extremely low voltage, the converter (1) operating in discontinuous mode, wherein the converter (1) comprises a self-oscillating charge pump (3a) having an array of interconnected ring oscillators (RO1-RON) for successively stepping up an input voltage (Vin) so as to result in the accumulated voltage (XN) at the last ring oscillator (RON), an amplifier (3b) and a pulse signal generator (3c) that generates a pulse signal that actuates a switch (11) so that the stepped-up, output voltage may be provided via a diode (12). The invention further relates to a method for actuating the DC-DC converter (1) for a power source (2) generating extremely low voltage.

16 Claims, 6 Drawing Sheets

(56) References Cited

U.S. PATENT DOCUMENTS

2016/0359409 A1* 12/2016 Theoduloz ............ H02M 3/156
2017/0070138 A1* 3/2017 Ogawa .................. H02M 3/156
2017/0170722 A1* 6/2017 Jung .................... H03K 3/0315
2018/0019661 A1* 1/2018 Gao ........................ H02J 50/00

* cited by examiner

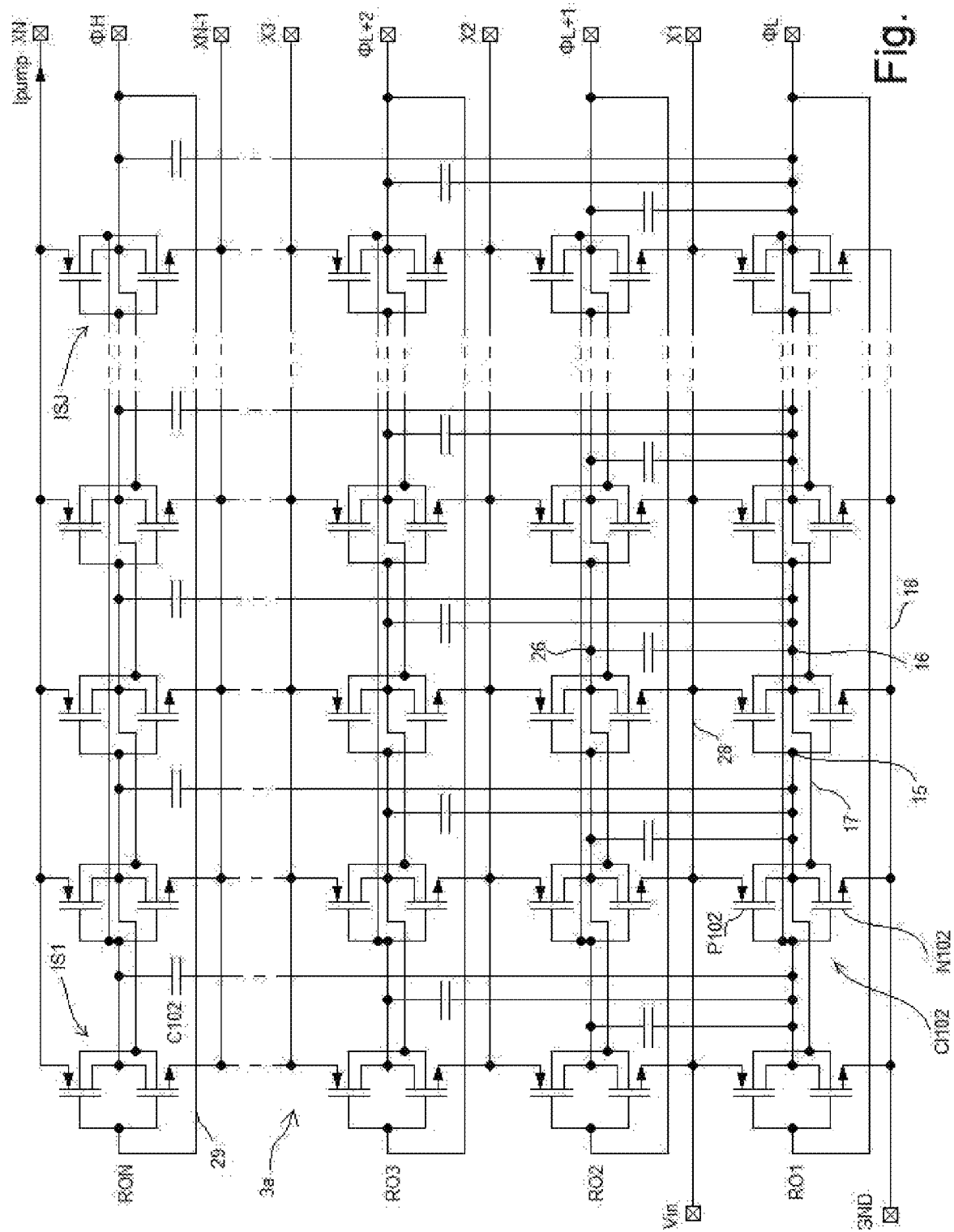

DC-DC CONVERTER FOR A LOW VOLTAGE POWER SOURCE

CROSS REFERENCE TO RELATED APPLICATION

This application claims priority from European Patent Application No. 18206016.0 filed Nov. 13, 2018, the contents of all of which are incorporated herein by reference 5 in their entirety.

FIELD OF THE INVENTION

On a general level, the invention concerns a DC-DC converter for low voltage power source, the converter operating in discontinuous mode. The DC-DC converter comprises an inductor connected to a power source, which is a voltage source, a switch connected to the inductor and controlled by a controller and a diode element connected to a connection node of the inductor and the switch to provide an output voltage.

The invention also concerns a method for actuation of a DC-DC converter for low voltage power source.

BACKGROUND OF THE INVENTION

There is a number of power sources, e.g. solar cells, that are only able to deliver very low voltage. Typically, this delivered low voltage needs to be increased so that it comes to practical use. To this end, a transformer may be used, which is expensive, rather bulky and significantly complicates the production process.

As shown in FIG. 1, another way to increase voltage generated by a low voltage power source 2 is to use a boost (step-up) DC-DC converter 1. The circuit has an inductor $L_X$ connected between an input of the power source 2 through a resistor Rin, which supplies a Vin voltage, and an output through which an output voltage Vout is obtained and accumulated on an output capacitor Cout. To maximize the circuit efficiency, the DC-DC converter 1 includes a maximum power point tracking (MPPT) which regulates the input loading conditions. Further circuit components, such as a diode element 12, switches 11, 13 and transistors 14, 15 are also included in the circuit 1. As shown, this solution would also have to include other functions such as a cold start module in a controller 10, battery (BAT) and battery charger (CHARGER) to ensure energy storage when the power source 2, such as a photocell, has a too low voltage. Other peripherals need also to be embedded for blocks such as regular operation oscillator (OSC), bias and custom control logic to function properly. In the related context, these different blocks have to be co-designed in order to maximize efficiency over different power ranges.

However, when energy storages of the converter are empty, these systems are rather difficult to start up. More specifically, in these situations the system must start without any stored energy and the required energy needs to be harvested externally. In the art, this is frequently referred to as "cold start".

A DC-DC converter addressing this problem is disclosed in the patent EP 3 101 793 B1. In this context, it is desirable to make the DC-DC converters of this type readily scalable and reduce their power consumption. Still with reference to the patent EP 3 101 793 B1, it is desirable to achieve DC-DC converters capable of stepping up even lower input voltages, typically voltages below 100 mV.

The patent application US 2011/0279105 A1 describes a switching power supply device able to be operated at low supply voltage. It includes a ring oscillator with an odd number of inverters to turn on and off a switch linked to output of an inductor of a switching regulator. It is not provided to start at a very low voltage at input of the switching regulator.

The patent application WO 2015/120131A1 describes a self-oscillating DC-DC converter structure in which an oscillator is completely internalized within the switched-capacitor network. A first ring oscillator is connected in series with a second ring oscillator to operate as a charge pump. With this structure the output voltage is only the double of the input voltage.

SUMMARY OF THE INVENTION

It is therefore an object of the invention to overcome the drawbacks of the state of the art by providing a DC-DC converter with a low start-up power being able to operate when supplied by a power source generating extremely low voltages, typically not exceeding 100 mV.

To this end, the invention concerns the afore-cited DC-DC converter, which includes the features defined in the independent claim 1.

Particular embodiments of the DC-DC converter are defined in the dependent claims 2 to 15.

One advantage of the DC-DC converter of the invention lies in the fact that it can cold start using an extremely low input voltage, well below 100 mV. Further, the DC-DC converter of the invention can provide an output voltage for use in a conventional electronic circuit, having voltage of around 1.5 V. Also, only one inductor element is used, while avoiding the use of a transformer with two magnetically coupled inductors. Hereby, cost as well as space savings are achieved. Above advantages are achieved even if the maximum power that can be delivered by an input voltage source is low. Here, the input voltage source may be a thermoelectric (Pelletier) element or a photovoltaic cell.

Advantageously, the design of the DC-DC converter makes it inherently capable of input impedance matching. Accordingly, it may automatically adjust input power so as to convert a very low input voltage into an output voltage sufficient to power the electronic components of a circuit. Moreover, the controller is directly powered by the input voltage source and no further power source is required.

Further, the fact that clock signal information is obtained, i.e. extracted, based on the output of the array of interconnected ring oscillators contributes to a more efficient converter. In addition, the design of the DC-DC converter at hand makes it fully scalable, hence usable in different CMOS manufacturing processes, in particular those having smaller line widths.

The invention also concerns a method of actuating a DC-DC converter, which includes the features defined in the independent claim 16.

BRIEF DESCRIPTION OF THE DRAWINGS

The objects, advantages and features of the DC-DC converter with low start-up power and voltage and the method for actuation of the DC-DC converter will appear more clearly in the following description made with reference to at least one non-limiting embodiment, illustrated by the drawings, in which:

FIG. 3b is an alternative way of representing the self-oscillating charge pump of FIG. 3a.

DETAILED DESCRIPTION OF THE INVENTION

In the following description, all those elements of the DC-DC converter that are well known to those skilled in the art in this technical field will be described only in a simplified manner. The DC-DC converter is arranged to convert a very low input voltage into an output voltage sufficient to power the electronic components of a circuit.

Figure 1:
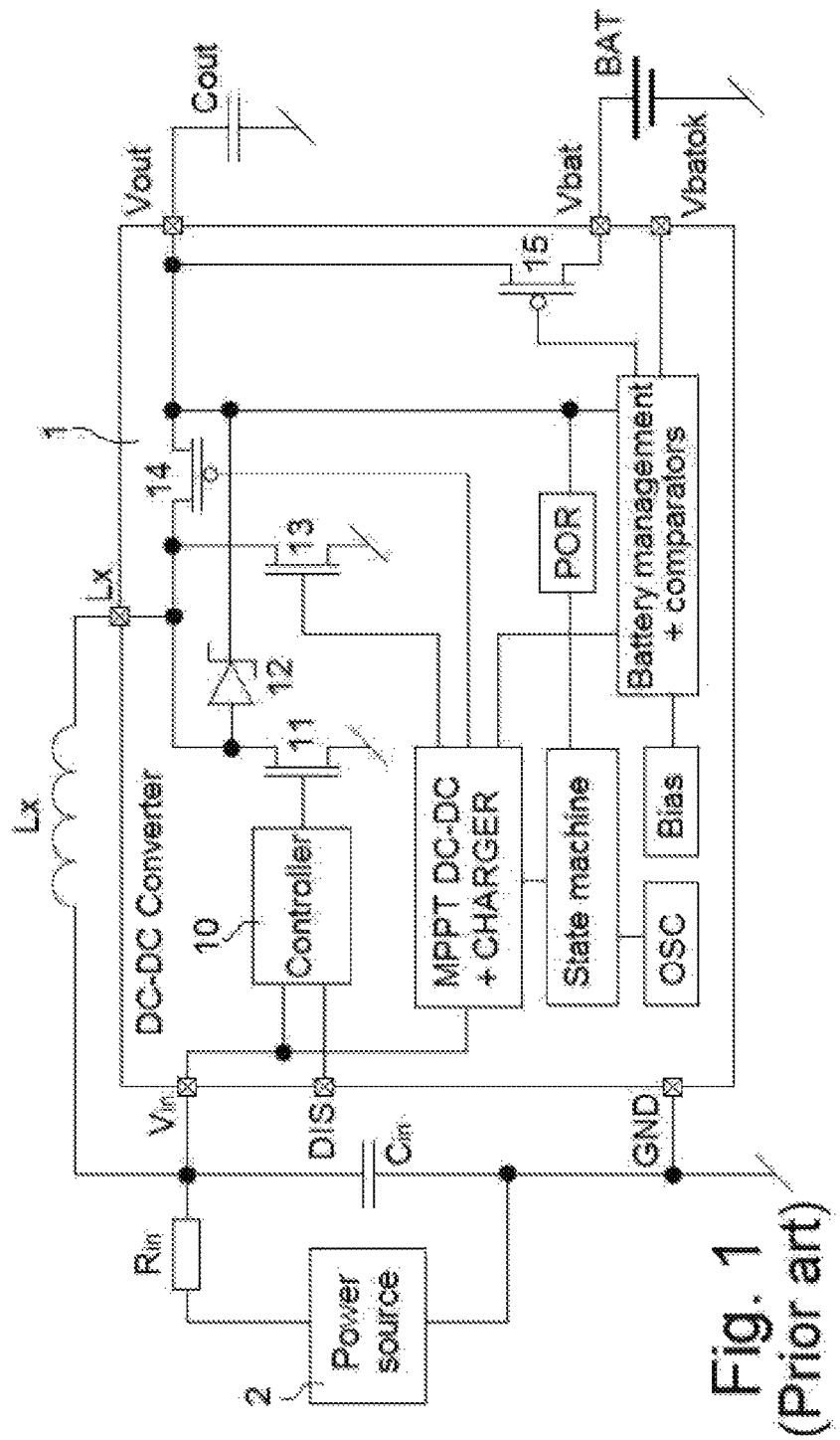
FIG. 1 shows a circuit with a boost DC-DC converter belonging to state of the art.

As already above-mentioned in relation to FIG. 1 of the prior art, the circuit with a boost DC-DC converter 1 has an inductor $L_X$ and requires a boost converter 1 as the voltage of a power source 2 (solar panels or thermoelectric generator) can be in the range of 10 mV-600 mV, depending on exterior conditions. The circuit includes components, such as a diode element 12, switches 11, 13 and transistors 14, 15 are also included in the circuit 1. The DC-DC converter 1 includes for this invention a new controller 10 as a cold start module. Furthermore it can be provided battery (BAT) and battery charger (CHARGER) to ensure energy storage when the environmental conditions are not providing enough energy to harvest (for instance at night in the case of a photovoltaic cell or when the thermal gradient is cancelled for a thermoelectric generator). Other peripherals already known need also to be embedded for blocks such as regular operation oscillator (OSC), bias and custom control logic to function properly. In the related context, these different blocks have to be co-designed in order to maximize efficiency over different power ranges.

Figure 2:
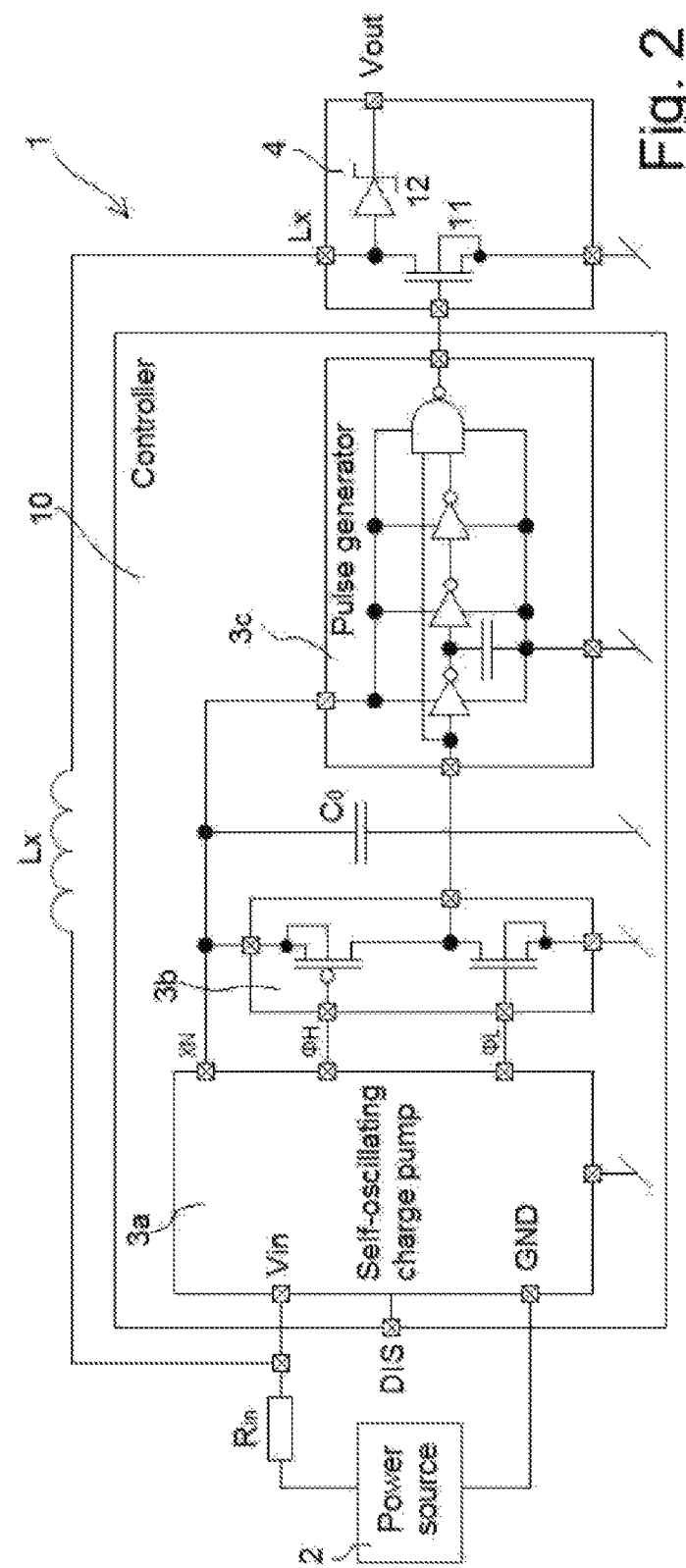
FIG. 2 shows a DC-DC converter for supplying an output voltage in accordance with one embodiment of the present invention, the converter being connected to a power source.

FIG. 2 shows a DC-DC converter 1 for supplying an output voltage in accordance with one embodiment of the present invention, the converter 1 being connected to a power source 2. The DC-DC converter 1 is suitable for low voltage power source 2 and it operates in discontinuous mode. The converter 1 comprises an inductor $L_X$ for connection to the power source 2 providing through an input resistor Rin, an input voltage Vin to be converted, a switch 11 connected to the inductor $L_X$ and controlled by a controller 10 and a diode element 12 connected to a connection node of the inductor $L_X$ and the switch 11 to provide an output voltage Vout. The controller 10 comprises a self-oscillating charge pump 3a with an array of interconnected ring oscillators. The charge pump 3a, its parts and operation will be more thoroughly described in connection with FIGS. 3a and 3b.

The controller 10 further comprises an amplifier 3b configured to generate a control signal, said control signal including clock signal information, wherein clock signal information is obtained based on the output of the array of interconnected ring oscillators. More specifically, the amplifier 3b is controlled by two-phase signals ϕH, ϕL originating from the self-oscillating charge pump 3a. The two-phase signals ϕH, ϕL are in phase and have the same amplitude. The amplifier 3b will be more thoroughly described in connection with FIG. 5.

The controller 10 further comprises a storage capacitor $C_O$ connected between the output XN of the self-oscillating charge pump 3a and an earth terminal, and a pulse signal generator 3c that generates a pulse signal based on the control signal. Said pulse signal actuates the switch 11 so that the diode element 12 may provide the converter output voltage Vout.

In the non-limiting embodiment shown in FIG. 2, the switch 11 is a MOS transistor, such as an NMOS transistor, connected between the inductor $L_X$ and an earth terminal. The switch gate receives the pulse signal. The diode element 12 is a Schottky diode arranged between a connection node of the inductor $L_X$ and the MOS transistor 11 and a voltage Vout output terminal of the DC-DC converter 1.

One advantage of the DC-DC converter 1 of FIG. 2 lies in the fact that it can cold start the circuit using an extremely low input voltage, well below 100 mV. Further, the DC-DC converter 1 of the invention can provide a stepped-up output voltage for use in a conventional electronic circuit, having voltage of around 1.5 V. Here, the input voltage source may be a thermoelectric (Pelletier) element or a photovoltaic cell.

The design of the DC-DC converter makes it inherently capable of input impedance matching. Moreover, the fact that clock signal information is obtained based on the output of the at least one ring oscillator, i.e. the clock signal extraction process, contributes to a more efficient converter. More specifically, the clock signal of the ring oscillator is the input signal for the subsequent amplifier.

The DC-DC converter of the present invention is actuated in the following manner. Initially, by means of the array of interconnected ring oscillators a voltage XN is built-up in the charge pump 3a. Subsequently, the control signal is generated by the amplifier 3b using output of the interconnected ring oscillators, whereupon this control signal is used and the pulse signal for controlling the switch 11 is generated by means of the pulse signal generator 3c. The conduction of the connected switch 11 is controlled during a first period Tn to obtain a current build-up in the inductor $L_X$. Thereafter, the switch 11 is disconnected during a second period Tp to induce a decreasing current in the inductor $L_X$, which is transferred through the diode element 12 to provide a converter output voltage Vout. Finally, the DC-DC converter 1 is inactivated once the current in the inductor $L_X$ is zero so that no current enters or leaves the DC-DC converter 1 until the end of the switching cycle period T of the switch 11. The duty cycle d=Tn/T between the first period Tn when the switch 11 is conducting and the switching cycle period T decreases when the input voltage Vin decreases until delay reaches its saturation point, keeping the duty cycle on a constant level so that the pulse signal cannot increase further. This entails that the components are protected against prohibitively high output voltages that might build-up in the converter. Accordingly, by virtue of the inventive method the top value of the output voltage may be indirectly controlled by means of the pulse signal.

It is to be noted that once output voltage Vout is stabilised and sufficient to power a circuit connected to the DC-DC converter 1, an external unit can stop said DC-DC converter or mainly the controller 10 by actuating the input DIS of DC-DC converter 1. So a disable function can be implemented in the DC-DC converter 1 to stop the controller 10.

It is therefore possible to envisage using another more efficient DC-DC converter as shown in FIG. 1, which permits execution of a MPPT algorithm once actuated.

Figure 3A:
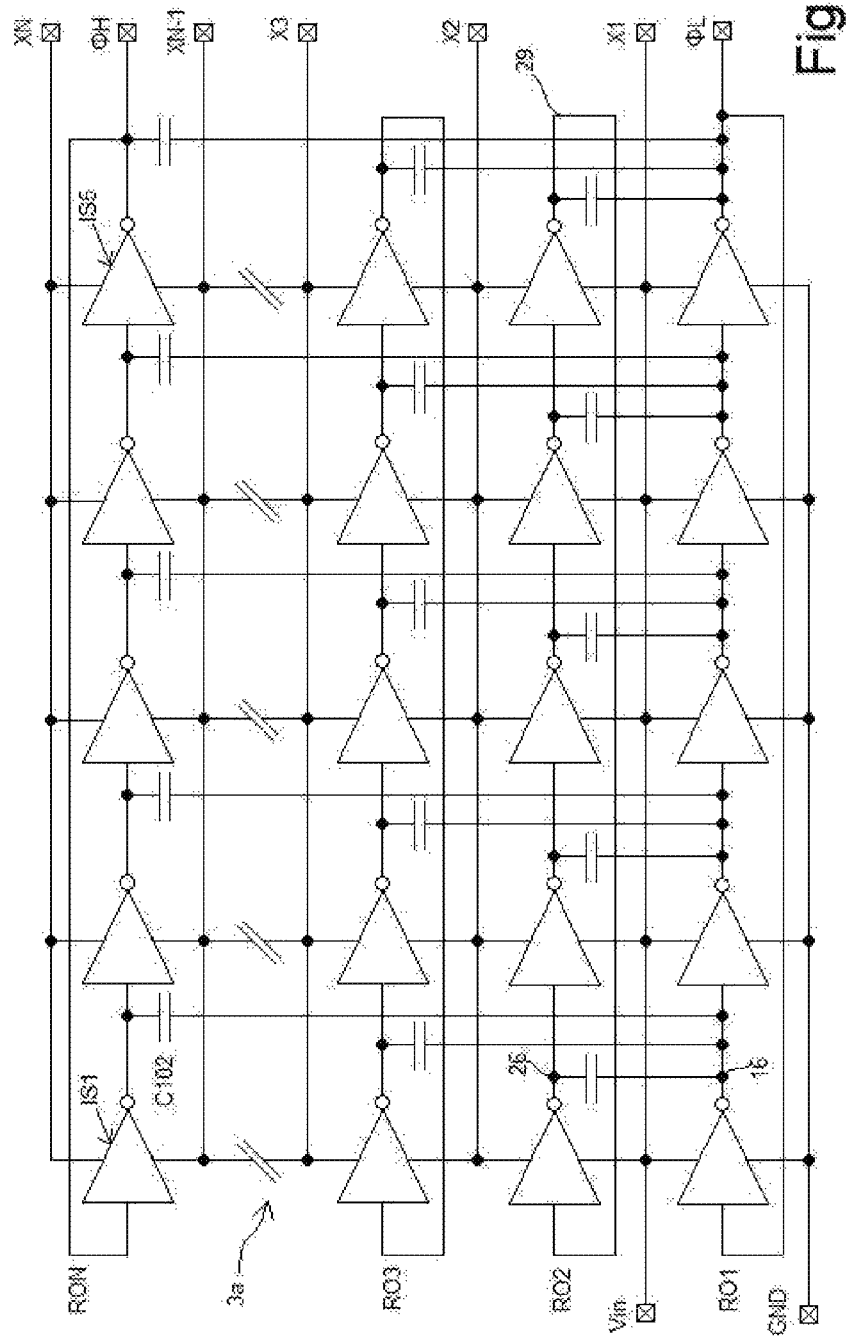
FIG. 3a shows one embodiment of a self-oscillating charge pump in accordance with one embodiment of the invention.

FIG. 3a shows a self-oscillating charge pump 3a in accordance with one embodiment of the invention. It is shown an array of interconnected ring oscillators RO1-RON, each including at least five successive inverter stages IS1-IS5. As easily seen, the last inverter stage IS5 is connected in a loop 29 to the first inverter stage IS1. The number of inverter stages IS needs to be odd and equal to or greater than five to enable dynamic threshold well bias application. An array of interconnected ring oscillators RO1-RON is arranged and operated in such a way that the input voltage Vin provided at a connection node of the first ring oscillator RO1 and the second ring oscillator RO2, is successively stepped-up while being transferred from one ring oscillator to the subsequent ring oscillator. Each ring oscillator RO1-RON provides intermediate voltage output, e.g. X1, X2, X3. As a result, the voltage at the last ring oscillator RON is the accumulated voltage XN based on intermediate voltages X1-XN−1. The resulting accumulated voltage XN is the output voltage of the self oscillating charge pump 3a. Output current of the charge pump 3a is $I_{PUMP}$ (shown in FIG. 3b). The process of stepping up and transferring voltage is described in more detail in connection with FIG. 4. As previously disclosed, the self-oscillating charge pump 3a also generates the two-phase signals φH, φL to control the operation of the amplifier (discussed in connection with FIG. 5). The first signal φL is provided at output of the first ring oscillator RO1, whereas the second signal φH is provided at output of the last ring oscillator RON. A capacitor C102 is connected between each output 16 of each inverter IS of the first ring oscillator RO1 and successively each output 26 of each inverter IS of the other ring oscillators RO2-RON.

With reference to FIG. 3b, it is shown a charge pump 3a with N ring oscillators RO1-RON, each ring oscillator having J inverter stages IS1-ISJ. Inverter stages IS are arranged in the matrix-like structure of FIG. 3b having rows and columns. Each ring oscillator represents one row. Still with reference to FIG. 3b, in a non-limiting embodiment a capacitor C102 is connected between each output 16 of each inverter IS of the first ring oscillator RO1 and successively each output 26 of each inverter IS of the other ring oscillators RO2-RON. Also visualised in the embodiment of FIG. 3b is that all capacitors C102 of the charge pump that belong to one column of inverter stages IS are interconnected from the output 16 of the corresponding inverter of the first ring oscillator RO1. In other words, all capacitors C102 associated with a given inverter stage of each ring oscillator are mutually interconnected. This advantageously entails a reduced internal impedance in the charge pump 3a. Further, for all ring oscillators RO1-RON, the last inverter stage ISJ has a connection 29 to the first inverter stage IS1 of the same ring oscillator.

Still with reference to FIG. 3b, inverter stages comprise a PMOS transistor P102 mounted in series with an NMOS transistor N102 so that a CMOS inverter CI102 is obtained. As shown, source terminals of the respective transistor P102, N102 are connected on the one hand to low terminal 18 of the ring oscillator RO1 for example, and on the other hand to high terminal 28 of the ring oscillator RO1 for example. The output 16 of each CMOS inverter CI102 of the ring oscillator is connected to an input 15 of a successive inverter of the same ring oscillator. The well terminals 17 of PMOS transistor P102 and NMOS transistor N102 of an inverter of the ring oscillator is connected to the output 16 of a successive inverter of the same ring oscillator. This arrangement enables above-mentioned dynamic threshold application.

It is to be noted that other phase signals φL+1 and φL+2 can be provided between the normal two-phase signals φH, φL for controlling a subsequent amplifier of the controller.

Figure 4:
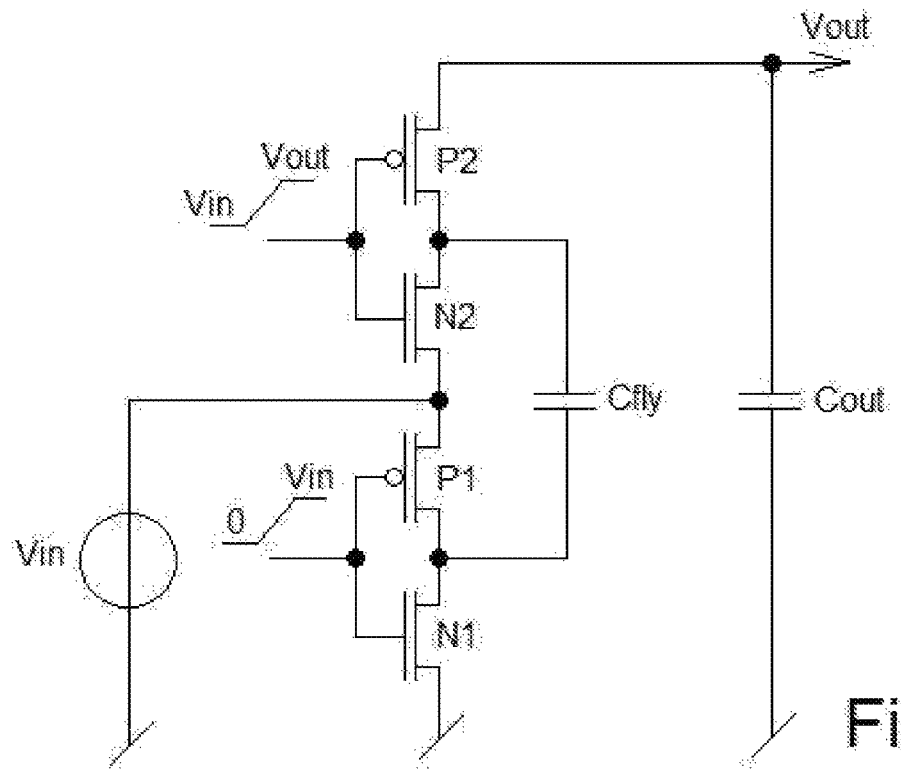
FIG. 4 shows a transistor level implementation of a voltage doubler built using CMOS inverter gates according to one embodiment of the invention.

FIG. 4 shows a transistor level implementation of a doubler inverter stage IS corresponding to a ladder, i.e. of two interconnected oscillator rings discussed in connection with FIGS. 3a and 3b and according to one embodiment of the invention. Here, complementary switches are assumed instead of transistors N1, P1, N2, P2. In the shown embodiment, in the first phase the capacitor charges through the switch and its bottom plate is grounded through the switch. The switches introduce a first voltage drop. At the next transition the charge will be transferred to an output capacitor Cout. The capacitor Cfly is now flying on the output capacitance Cout and transfers its charge through the switch and its bottom plate is connected to the lower voltage power source through the switch.

In the charging phase, the voltage can be estimated as:

$$V_{CFLY_C} = V - 2 \cdot V_{SWN}$$

In the charge transfer phase, the voltage can be estimated as:

$$V_{OUT} = 2 \cdot V - 2 \cdot (V_{SWN} + V_{SWP})$$

where, $V_{SWN}$ and $V_{SWP}$ are voltages across the switches in the charging, respectively, charge transfer phase. By switching each inverter N1, P1, N2, P2 as shown in FIG. 4, one can have an output voltage Vout two times higher than the input voltage Vin.

One important parameter in connection with FIG. 4 is the voltage drop. The voltage drop at each inverter stage may be calculated as 25.5 mV for a power source supplying voltage at 80 mV.

Figure 5:
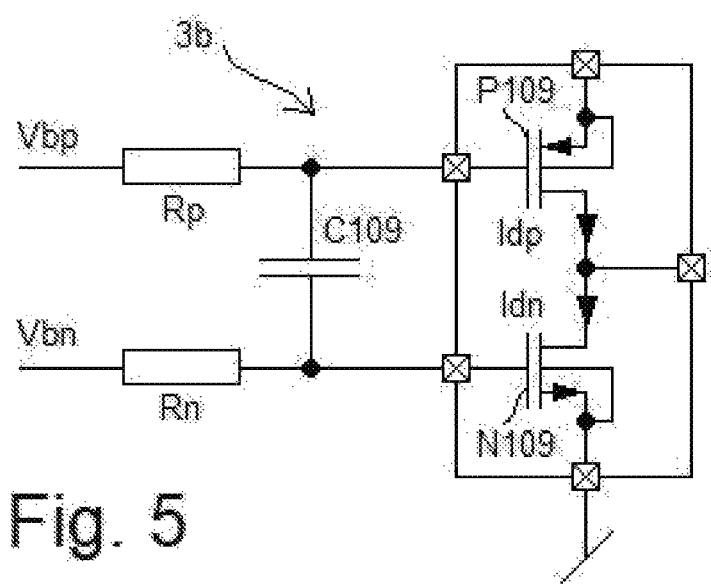
FIG. 5 shows an amplifier according to one embodiment of the invention.

FIG. 5 shows an amplifier 3b according to one embodiment of the invention. The amplifier 3b comprises a further PMOS transistor P109 mounted in series with a further NMOS transistor N109. The gate terminal of the further PMOS transistor P109 is connected to the output of an inverter stage of a ring oscillator (not shown in FIG. 5) so that the ring oscillator output voltage Vbp is applied to the gate of the PMOS transistor P109. Analogously, the gate terminal of the further NMOS transistor N109 is connected to the output of an inverter stage of another ring oscillator (not shown in FIG. 5) so that this ring oscillator's output voltage Vbn is applied to the gate of the NMOS transistor N109. Internal resistances Rp and Rn are also shown. Amplifier currents Idp and Idn flow from the well terminal of the further PMOS transistor P109 to the well terminal of the further NMOS transistor N109. A further capacitor C109 is connected to the further PMOS transistor P109 and the further NMOS transistor N109. In a preferred embodiment, the further PMOS transistor P109 is connected to the output of the last inverter stage IS of a ring oscillator and the gate terminal of the further NMOS transistor N109 is connected to the output of the last inverter stage IS of another ring oscillator. By way of example, the amplifier could be a power amplifier of the A-B type.

Figure 6:
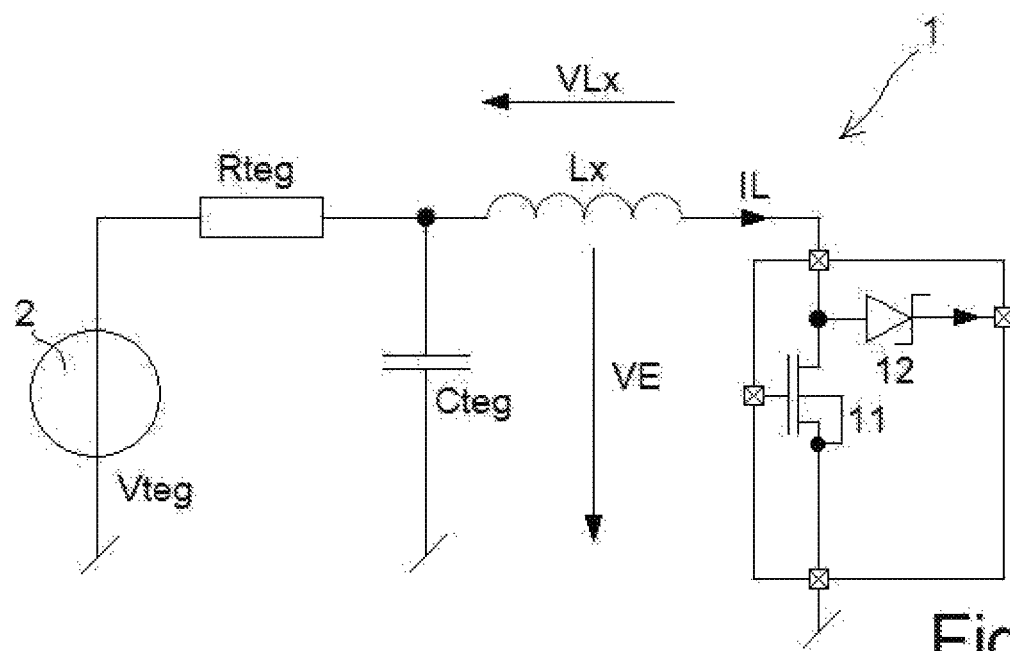
FIG. 6 shows a boost DC-DC converter for low voltage power source according to one embodiment of the invention.

FIG. 6 shows a boost DC-DC converter 1 for a low voltage power source 2 according to one embodiment of the invention. The power source 2 delivers a voltage Vteg and has internal resistance Rteg and capacitance Cteg.

With respect to its operation, during the first period Tn, a transistor 11 is on and the harvester voltage is applied. Accordingly, the current across the inductor $L_X$ increases:

$$V_{Lx}=V_E=L_x\cdot\Delta I_L/dt$$

$$\Delta I_L=(1/L_x)\cdot V_E\cdot D\cdot t$$

During the second period Tp, the transistor 11 is off and a diode element 12 is on. Therefore, the voltage across the inductor $L_X$ is the input voltage minus the output voltage and therefore the current drops:

$$V_{Lx}=V_E-V_{SO}=L_x\cdot\Delta I_L/dt$$

$$\Delta I_L=(1/L_x)\cdot(V_{SO}-V_E)\cdot d\cdot t$$

$$V_E\cdot D=(V_{SO}-V_E)\cdot d \text{ where } d=(V_E/(V_{SO}-V_E))\cdot D$$

For the remainder of the switching period T, the current across the inductor $L_X$ is zero. This entails that the current is cancelled in the diode element 12 as well. In addition, the voltage along the inductor $L_X$ is also null. During this time period, the DC-DC converter 1 is inactivated.

Still with reference to the boost DC-DC converter 1 of FIG. 6, all components of the DC-DC converter 1, such as the charge pump, the amplifier and the pulse signal generator, may be made in the same integrated circuit in CMOS technology. The design of the DC-DC converter 1 of FIG. 6 makes it fully scalable, hence usable in different CMOS manufacturing processes, in particular those having smaller line widths, e.g. 65-nm process.

The exemplary DC-DC converter 1 is suitable for stepping-up input voltages of below 100 mV, more preferred for voltages between 60 mV and 80 mV. The typical power source 2 for the DC-DC converter of the present invention is a thermoelectric generator and the input voltage Vin of the thermoelectric generator is magnified at least 15 times. Here, the input voltage Vin is magnified so that the output voltage Vout exceeds 1.3 V, i.e. is sufficient to power a conventional electronic circuit.

Figure 7:
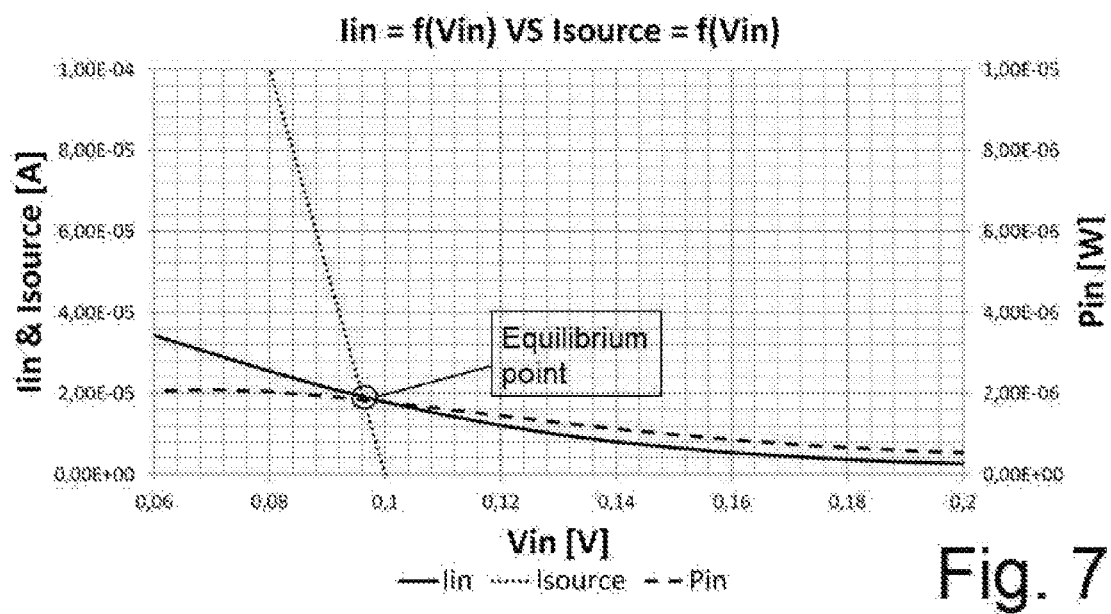
FIG. 7 shows the equilibrium operating point of the DC-DC converter of the present invention.

FIG. 7 shows an operating diagram of the DC-DC converter connected to a power source to supply an output voltage for a load according to the invention with curves plotted as a function of the mean input current relative to the output voltage and the equilibrium point.

A mean current Iin is output from power source, which is preferably a voltage source, with an input voltage of the DC-DC converter at Vin. The power source is typically a thermoelectric generator.

For the power source, model operation can be created with an internal voltage source connected to an internal resistor, through which the power source output voltage Vin decreases with the increase in output current Iin. The power source may provide a load voltage of below 100 mV with an internal resistance of around 2 kOhms for example. In that case, the first curve of the function Iin=f(Vin) is shown to illustrate the variation in current Iin relative to power source voltage Vin. Conversely, the second curve of the function Iin=f(Vin) relating the operation in DC-DC converter, shows that mean input current Iin decreases in a non-linear manner when input voltage Vin decreases. The input impedance of DC-DC converter increases when there is a drop in input voltage Vin towards the equilibrium point. The DC-DC converter will thus automatically decrease the required mean input current Iin, when input supply voltage Vin decreases. Accordingly, the assembly formed of power source and DC-DC converter will stabilise at an equilibrium operation point at the intersection of the Iin- and Vin-curves. This depends on the output power available from the power source, which is typically low for operation of the DC-DC converter of the present invention.

From the description that has just been given, several variants of the discontinuous conduction mode DC-DC converter can be devised by those skilled in the art without departing from the scope of the invention defined by the claims. A single output diode could be provided instead of a Schottky diode, but the voltage drop would be greater. It is possible to increase the number of inverters in the oscillator rings and/or the number of delay stages in the pulse signal generator to increase or decrease the duty cycle.

Further, it is to be understood that the DC-DC converter of the present invention is primarily to be used in "cold start" situations. In other relevant situations, the DC-DC converter is normally bypassed so as not to degrade the overall efficiency of the system.

The invention claimed is:

1. A DC-DC converter (1) for a low voltage power source (2), the converter operating in discontinuous mode, wherein the converter (1) comprises an inductor ($L_X$) for connection to the power source (2) providing an input voltage (Vin) to be converted, a switch (11) connected to the inductor ($L_X$) and controlled by a controller (10) and a diode element (12) connected to a connection node of the inductor ($L_X$) and the switch (11) to provide an output voltage (Vout), wherein
   the controller (10) comprises a self-oscillating charge pump (3a), wherein the self-oscillating charge pump (3a) comprises
      an array of interconnected ring oscillators (RO1-RON), each including a number J of successive inverter stages (IS), where J is an integer odd number equal to or greater than 5 and a last inverter stage (IS) is connected in a loop to a first inverter stage (IS), wherein the input voltage (Vin) is provided at a connection node of a first ring oscillator (RO1) and a second ring oscillator (RO2), said input voltage (Vin) being successively stepped-up while being transferred from one ring oscillator (ROX) to a subsequent ring oscillator (ROX+1) resulting in an accumulated voltage (XN) at a last ring oscillator (RON), wherein the accumulated voltage (XN) is an output voltage of the self oscillating charge pump (3a), and wherein
      each inverter stage (IS) comprises a PMOS transistor (P102) mounted in series with an NMOS transistor (N102) so that a CMOS inverter (CI102) is obtained and, for at least one inverter stage (IS) of the at least one ring oscillator (RO1-RON), wherein
   the controller (10) further comprises an amplifier (3b) comprising at least a further PMOS transistor (P109) mounted in series with at least a further NMOS transistor (N109), the source of the PMOS transistor (P109) of the amplifier (3b) being connected to the output of the last ring oscillator (RON), which outputs the accumulated voltage (XN), wherein a gate terminal of the further PMOS transistor (P109) is connected to an output of any one inverter stage (IS) of a ring oscillator (RO) and a gate terminal of the further NMOS transistor (N109) is connected to the output of any one inverter stage (IS) of another ring oscillator (RO) and a further capacitor (C109) is connected to the further PMOS transistor (P109) and the NMOS transistor (N109), wherein the amplifier (3b) is configured to generate a control signal, said control signal including clock signal information, wherein the clock signal information is obtained based on an output of the array of interconnected ring oscillators (RO1-RON), wherein the controller (10) further comprises a pulse signal generator (3c) that generates a pulse signal based on the control signal and the pulse signal actuates the switch (11) so that the diode element (12) may provide the output voltage (Vout).

2. THE DC-DC converter (1) according to claim 1, wherein said each inverter stage (IS) having the PMOS transistor (P102) mounted in series with the NMOS transistor (N102) has a well terminal of a respective transistor (P102, N102) connected to an output voltage terminal of the CMOS inverter (CI102) of a subsequent inverter stage (IS) in each ring oscillator RO1-RON).

3. THE DC-DC converter (1) according to claim 1, wherein the gate terminal of the further PMOS transistor (P109) is connected to an output of the last inverter stage (IS) of the ring oscillator (RO) and the gate terminal of the further NMOS transistor (N109) is connected to the output of the last inverter stage (IS) of the another ring oscillator (RO).

4. THE DC-DC converter (1) according to claim 1, wherein a capacitor (C102) is arranged between an output node (26) of an inverter stage (IS) being part of the ring oscillator (RO) and an output node (16) of a corresponding inverter stage (IS) being part of the another ring oscillator (RO).

5. THE DC-DC converter (1) according to claim 4, wherein, all capacitors (C102) associated with a given inverter stage (IS) of each ring oscillators (RO1-RON) are interconnected.

6. THE DC-DC converter (1) according to claim 1, wherein the ring oscillators of the array of interconnected ring oscillators (RO1-RON) are arranged in ladder configuration.

7. THE DC-DC converter (1) according to claim 1, wherein the amplifier (3b) is controlled by two-phase signals (φH, φL) from the self-oscillating charge pump (3a).

8. THE DC-DC converter (1) according to claim 7, wherein the two-phase signals (φH, φL) are in phase and have the same amplitude.

9. THE DC-DC converter (1) according to claim 1, wherein the amplifier (3b) is a power amplifier of a A-B type.

10. THE DC-DC converter (1) according to claim 1, wherein the switch (11) is a MOS transistor, such as an NMOS transistor, connected between the inductor ($L_X$) and an earth terminal, whose gate receives the pulse signal, and the diode element (12) is a Schottky diode connected between a connection node of the inductor ($L_X$) and of the MOS transistor (11) and a voltage output terminal of the DC-DC converter (1).

11. THE DC-DC converter (1) according to claim 1, wherein all components of the DC-DC converter (1), such as the charge pump (3a), the amplifier (3b) and the pulse signal generator (3c), are made in a same integrated circuit in CMOS technology.

12. THE DC-DC converter (1) according to claim 1, wherein the DC-DC converter (1) is suitable for stepping-up the input voltages (Vin) of below 100 mV, more preferred for voltages between 60 mV and 80 mV.

13. THE DC-DC converter (1) according to claim 12, wherein the power source (2) is a thermoelectric generator and the input voltage (Vin) is magnified at least 15 times.

14. THE DC-DC converter (1) according to claim 13, wherein the input voltage (Vin) is magnified so that the output voltage (Vout) exceeds 1.3 V.

15. THE DC-DC converter (1) according to claim 1, wherein the pulse signal generator (3c) comprises a delay element and a logic gate of NAND-type.

16. A method for actuation of a DC-DC converter (1) for a low voltage power source (2), wherein the converter (1) operates in discontinuous mode and comprises an inductor ($L_X$) for connection to the power source (2) providing an input voltage (Vin) to be converted, a switch (11) connected to the inductor ($L_X$) and controlled by a controller (10), the switch (11) having a switching cycle period T, and a diode element (12) connected to the inductor ($L_X$) and connected to the switch (11) and arranged to provide an output voltage (Vout), the method comprising the steps of:

building-up voltage in a self-oscillating charge pump (3a) comprising an array of interconnected ring oscillators (RO1-RON), wherein the input voltage (Vin) is provided at a connection node of a first ring oscillator (RO1) and a second ring oscillator (RO2), and resulting in an accumulated built-up voltage (XN) at a last ring oscillator (RON), wherein the accumulated voltage (XN) is an output voltage of the self oscillating charge pump (3a), generating, by means of an amplifier (3b), a control signal, said control signal including clock signal information, wherein the clock signal information is obtained based on an output of the array of ring oscillators (RO1-RON) of the self-oscillating charge pump (3a), using the control signal and generating, by means of a pulse signal generator (3c), a pulse signal for controlling the switch (11), controlling a conduction of the connected switch (11) during a first period Tn to obtain a current build-up (IL) in the inductor ($L_X$), disconnecting the switch (11) during a second period Tp to induce a decreasing current (IL) in the inductor (3), which is transferred through the diode element (12) to provide the output voltage (Vout), inactivating the DC-DC converter (1) once the current in the inductor ($L_X$) is zero so that no current enters or leaves the DC-DC converter (1) until an end of the switching cycle period T of the switch (11), wherein duty cycle d=Tn/T between the first period Tn when the switch (11) is conducting and the period T decreases when the input voltage (Vin) decreases until delay reaches a saturation point keeping the duty cycle on a constant level so that the pulse signal cannot increase further.

* * * * *